United States Patent [19]

Ikegame et al.

[11] Patent Number: 4,475,152

[45] Date of Patent: Oct. 2, 1984

[54] WATER-COOLED HIGH VOLTAGE DEVICE

[75] Inventors: Hiroo Ikegame, Tokyo; Tadashi Takahashi, Kawasaki; Sumio Kobayashi, Yokohama, all of Japan

[73] Assignee: Tokyo Shibaura Denki Kabushiki Kaisha, Kawasaki, Japan

[21] Appl. No.: 381,444

[22] Filed: May 24, 1982

[30] Foreign Application Priority Data

May 28, 1981 [JP] Japan .................................. 56-80104

[51] Int. Cl.$^3$ ............................................. H02M 1/18
[52] U.S. Cl. .................................... 363/141; 361/379; 361/385
[58] Field of Search ........................... 62/418; 237/63; 361/379, 385; 363/141; 165/100, 108

[56] References Cited

U.S. PATENT DOCUMENTS 4,010,489  3/1977  Bourbeau et al. ............. 361/385 X
4,056,767 11/1977  Tobise et al. ........................ 361/141

Primary Examiner—William M. Shoop
Attorney, Agent, or Firm—Oblon, Fisher, Spivak, McClelland & Maier

[57] ABSTRACT

In a water-cooled high voltage device, a plurality of electrical modules are divided into a plurality of electrical units. The electrical modules are cooled by cooling water supplied from a pump through pipes which are disposed in the electrical units, respectively. The size of the pipe diameter is determined to be enough to allow cooling water to flow at a relatively low pressure and to properly cool the electrical modules.

4 Claims, 14 Drawing Figures

WATER-COOLED HIGH VOLTAGE DEVICE

BACKGROUND OF THE INVENTION

The present invention relates to a water-cooled high voltage device having: a plurality of electrical units three-dimensionally stacked in a plurality of levels, each electrical unit having a stackable frame and a plurality of electrical modules disposed at the frame; pumping means for delivering cooling water; and a pipeline network for supplying the cooling water to the electrical modules.

The water-cooled high voltage device of this type has been widely used. A water-cooled thyristor conversion device described later in an embodiment is a typical example. Along with a recent increase in power consumption, a high-voltage and large-current device is used for a power generating system, a power transforming system, an AC/DC conversion system and so on. A compact water-cooled high voltage device is desirable for easy installation. It is also desirable that the structure of the device be suitable for mass production, easy assembly, easy maintenance and repair. In response to the above needs, a method for manufacturing a high voltage device is proposed in which the device is divided into at least one type of standard electrical module for mass-production. Desired number of each type of modules are mounted on a frame to form a basic unit, that is, an electrical unit. A predetermined number of electrical units are integrally assembled and high voltage connections are performed to complete a single high voltage device.

In the high voltage device of the above arrangement, a compact device can be manufactured by appropriately designing the electrical module and the electrical unit. The installation space is thus decreased. However, the high voltage device as a whole is heated at a high temperature due to heat generated by each unit, resulting in degradation of performance of the device. Finally, the device may be broken. In order to eliminate this drawback, various cooling means are proposed. However, it is difficult to cool parts of the large-scaled high voltage device uniformly and efficiently. Temperatures of the units vary greatly as will be described below.

Figure 1:
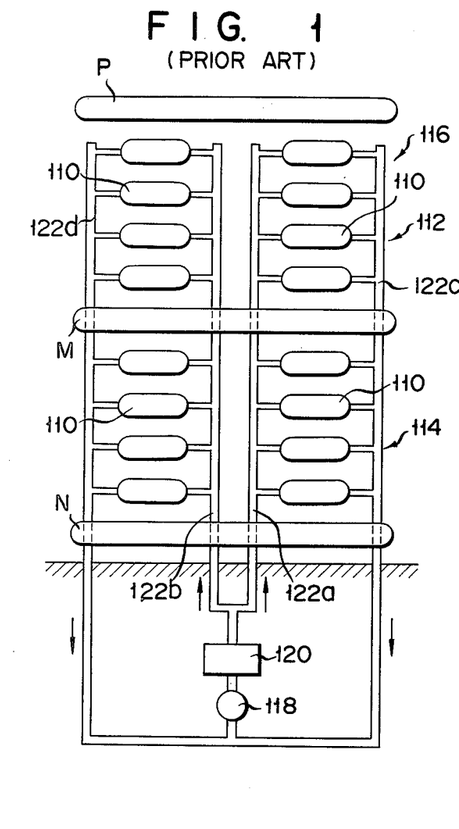
FIG. 1 is a view illustrating the one-phase arrangement of a conventional water-cooled high voltage device.

FIG. 1 shows a conventional water-cooled high voltage device 116 formed by stacking electrical units in two levels. In the water-cooled high voltage device 116, oblong members are electrical modules 110 of at least one type according to a standard design. Two sets of electrical modules 110 are aligned horizontally and eight electrical modules 110 are aligned vertically in each set, as shown in FIG. 1. These electrical modules 110 are mounted in a proper container. The container and thin wires are omitted so as to clearly show the arrangements of the electrical modules 110 and the pipeline network of the cooling water. This applies to the following drawings unless otherwise specified. Three conductors P, M, and N are connected to the water-cooled high voltage device 116. Eight electrical modules arranged between the conductors P and M are assembled integrally to form an upper level electrical unit 112, and eight electrical modules arranged between the conductors M and N are assembled integrally to form a lower level electrical unit 114. Although the three conductors P, M and N are illustrated in FIG. 1, the number of conductors may be arbitrarily selected in accordance with the type of device. An AC or DC voltage may be applied across the device and an AC or DC current may also flow therethrough.

Since the electrical modules 110 dissipate heat during operation, cooling water is supplied thereto. Water is usually delivered from a pump 118 which is installed underground or on the ground. The water is then cooled in a cooler 120. The cooling water rises in pipes 122a and 122b formed by an electrical insulator and is subsequently supplied from the lowest electrical modules 110 among the eight right electrical modules and the eight left electrical modules. The cooling water used for cooling the electrical modules 110 returns to the suction side of the pump 118 through pipes 122c and 122d made of an electrical insulator. The pump 118 is driven again to supply the cooling water to the electrical modules 110 which are then cooled. Since the electrical modules 110 have the same structure, the cooling water is supplied to the lower electrical modules 110 at a high pressure and in a great amount, while it is supplied to the upper electrical modules 110 at a relatively low pressure according to the above cooling system. As a result, temperature of the electrical modules at high level are higher than that of the electrical modules at low level.

Figure 2:
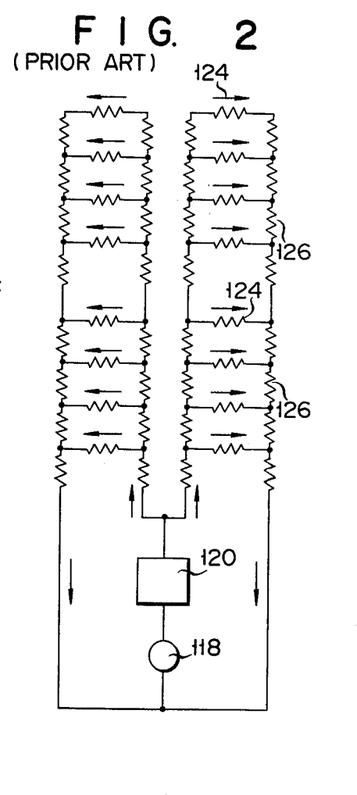
FIG. 2 is a view illustrating a cooling water pipeline network included in the arrangement shown in FIG. 1.

FIG. 2 shows a cooling water pipeline network of the water-cooled high voltage device 116 shown in FIG. 1. The flow path of the water pipeline network in FIG. 2 correspond to that in FIG. 1. A zigzag symbol denotes a flow resistance in a corresponding portion. Reference numeral 124 denotes a flow resistance acting on the cooling water flowing through the electrical module 110. Reference numeral 126 denotes a flow resistance of the pipe 122c connecting the vertically adjacent electrical modules 110. Arrows in FIGS. 1 and 2 denote the flow of the cooling water.

In an example shown in FIGS. 1 and 2, the number of vertically arranged electrical modules 110 is small. These electrical modules are distributed and arranged in electrical units 112 and 114. The device is formed by two-level electrical units 112 and 114. Therefore, the level difference between the upper and lower electrical modules 110 is relatively small. However, in a large-scaled high voltage device, the electrical units 112 and 114 are preferably stacked at three or four levels. A thyristor conversion device which has a rated DC voltage of 125 kV and a DC current of 1,200 A (measured in a three-phase bridge circuit) is mounted in the three-phase bridge circuit, the level difference becomes 3 to 6 m. Further, when the two three-phase bridge circuits are cascade-connected, the level difference becomes 10 to 12 m. It is very difficult to uniformly cool the electrical modules 110 in different levels.

Figure 3:
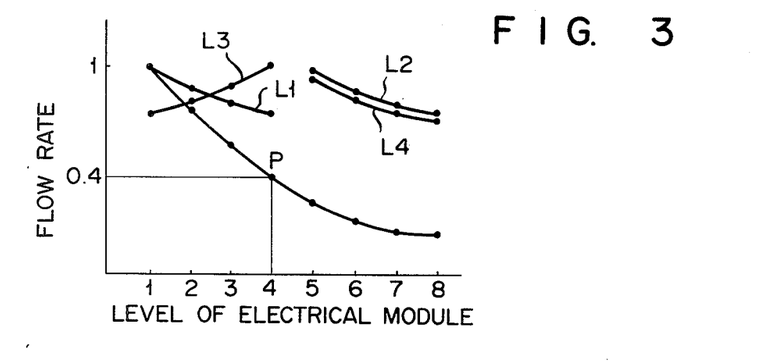
FIG. 3 is a graph for explaining various flow rates of the cooling water flowing through electrical modules included in the electrical units.

According to a graph in FIG. 3, the level of the electrical modules 110 is plotted along the axis of abscissa, while the flow rate of the cooling water flowing through the electrical module 110 as a function of the level of the electrical modules is plotted along the axis of ordinate. At point P, the flow rate of the cooling water flowing through the fourth electrical module 110 from the bottom is 0.4 times that of the cooling water flowing through the lowest electrical module. As is apparent from the graph, the upper electrical modules 110 are not sufficiently cooled. In order to solve the above problem, the diameters of the pipes 122a, 122b, 122c and 122d are enlarged to reduce the flow resistances in the pipes 122a to 122d. However, a piping work becomes cumbersome. Even if this operation is performed, the device as a whole becomes large in size.

Theoretically, a flow resistance 124 within the electrical modules 110A need only be designed to be larger than a flow resistance 126 within the vertically aligned pipes 122a to 122d. However, a high output pump must be used and the cooling water pressure is increased. Therefore, highly rigid pipes and joints must be used, resulting in inconvenience.

The hydrokinetic problems in the cooling water pipeline network have been considered so far. Larger diameter pipes also result in inconvenience from the electrical point of view. The electrical modules for a high voltage are disposed at high level, while the electrical modules for a low voltage are disposed at low level. The pipes 122a to 122d vertically extend between the electrical modules at high and low levels. Therefore, parts at high and low voltages are shortcircuited by the cooling water flowing through the pipes 122a to 122d. A leakage current flows through the cooling water. The conductors on the sides of the high and low voltages are electrically corroded. This electrical corrosion frequently occurs when large diameter pipes are used and a large amount of cooling water exists between the members of the high and low voltages. Especially, this phenomenon occurs in a recently developed thyristor conversion device in which resistors, reactors and so on used in cooperation with thyristor elements are directly cooled by the cooling water. Therefore, small diameter pipes are preferably used to increase the leak resistance between the members of high and low voltages. Although a highly pure cooling water may be used to extremely decrease electrical conductivity theoretically, special equipment for maintaining an extremely low electrical conductivity is required, resulting in economic disadvantages.

It is thus strongly desired to develop a water-cooled high voltage device, which requires a small installation space, which rarely causes electrical corrosion even if water obtained from the conventional ion exchanger is used, and which substantially uniformly cool each electrical module.

SUMMARY OF THE INVENTION

It is, therefore, an object of the present invention to provide a water-cooled high voltage device which requires a small installation space, which substantially eliminates flow of a leakage current, and which is substantially uniformly cooled.

In order to achieve the above object of the present invention, the pipeline network of the water-cooled high voltage device discribed at the beginning of this specification has a plurality of pipes each supplying cooling water delivered by the pumping means directly to each of the electrical units, respectively.

According to a water-cooled high voltage device using the pipeline network for circulating the cooling water according to the device described above, the cooling water supplied from the pump is not branched but supplied directly to a plurality of electrical modules included in a predetermined electrical unit. Therefore, the cooling water is supplied to the electrical modules in the upper electrical unit independently of the electrical modules in the lower electrical unit. All the electrical modules are thus substantially uniformly cooled.

The pipes which are vertically disposed from the pump to the electrical units need only flow the required amount of cooling water. As compared with the conventional cooling water supply system in which the cooling water is sequentially supplied first to the nearest pipes and then the farthest pipes, small diameter pipes can be used in the water-cooled high voltage device according to the present invention. Electrical corrosion due to the cooling water in the pipes is decreased and the service life of the device is prolonged.

In summary, since the electrical units having a plurality of electrical modules are stacked three-dimensionally, a necessary installation space is decreased. Further, since the cooling water from the pump is independently supplied to each electrical unit through separate pipes, all the electrical modules are substantially uniformly cooled. Further, since the diameter of the pipes is determined to be enough to supply the cooling water to the electrical modules belonging to each electrical unit, the leakage current which may flow between the electrical units is decreased and electrical corrosion is thus decreased.

DETAILED DESCRIPTION OF THE PREFERRED EMBODIMENTS

Water-cooled high voltage devices according to embodiments of the present invention will be described with reference to the accompanying drawings. In order to describe the present invention in detail, water-cooled thyristor conversion devices are exemplified in the following description.

Figure 4:
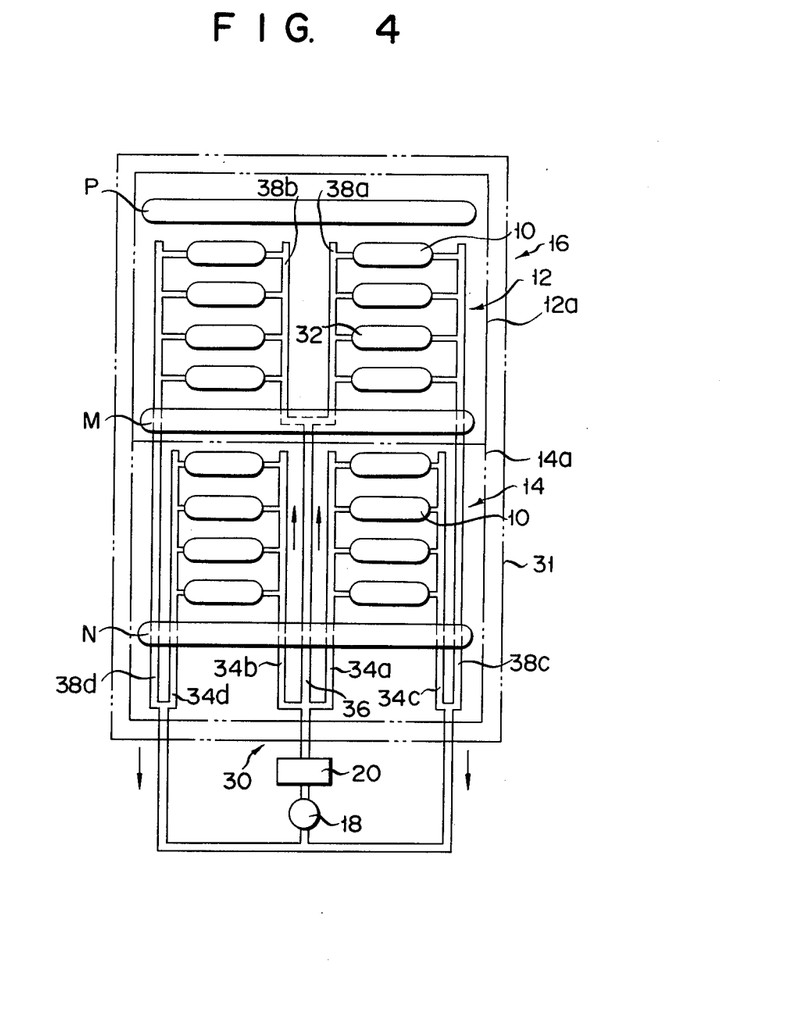
FIG. 4 is a view illustrating the one-phase arrangement of a water-cooled thyristor conversion device to which the present invention is applied.
Figure 5:
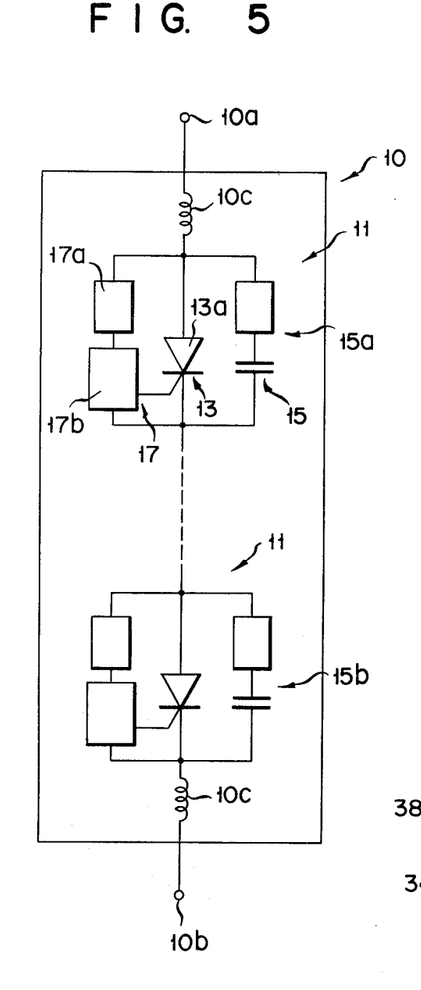
FIG. 5 is a block diagram of an example for explaining internal connections of the thyristor modules arranged in the device shown in FIG. 4.
Figure 7:
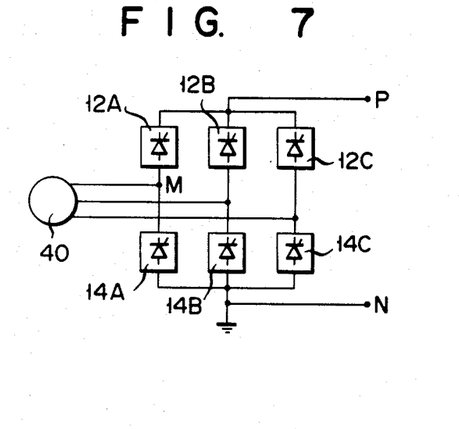
FIG. 7 is a block diagram of a three-phase bridge circuit used in the device according to the present invention.

FIG. 4 shows an arrangement of 16 electrical modules, that is, thyristor modules 10 (to be referred to as a module hereinafter for brevity) included in one phase of a water-cooled thyristor conversion device. The 16 modules 10 are arranged in the same manner as in the conventional device shown in FIG. 1. An electrical unit 12 (to be referred to as a unit hereinafter for brevity) of a high voltage side which includes eight modules 10 is mounted on a frame 12a. An electrical unit 14 (to be referred to as a unit hereinafter for brevity) of a low voltage side which includes eight modules 10 is mounted on a frame 14a. These units 12 and 14 are separately assembled and stacked. The units 12 and 14 are connected in series between a conductor P at the high voltage output side and a conductor N at the low voltage output side. A conductor M is connected to one phase of a three-phase a.c. power source and a connecting portion of the units 12 and 14. The units 12 and 14 are integrally stacked in two stages to form a thyristor valve 16 corresponding to one phase. FIG. 5 shows the main part of the electrical circuit of the module 10 shown in FIG. 4. The module 10 is connected to an external circuit through terminals 10a and 10b. A plurality of main electrical circuits 11 are connected in series with each terminal through each anode reactor 10c. Each main electrical circuit 11 comprises three circuits which are parallel-connected. A first circuit 13 comprises a thyristor element 13a. A second circuit 15 has a snubber circuit 15a. A third circuit 17 includes a voltage divider series circuit 17a and an amplifier 17b for gate firing. The mode of operation of the main electrical circuit 11 is known, and a detailed description thereof will be omitted. Two more thyristor valves same as the thyristor valve 16 are assembled. These thyristor valves are connected in the manner as shown in FIG. 7 to assemble a three-phase thyristor conversion device.

A case 31 shown in FIG. 4 houses a one-phase thyristor valve 16. Water delivered from a pump 18 and cooled by a cooler 20 is supplied to the case 31. The cooling water is then supplied to a cooling path 32 in each module through a cooling water pipeline network 30 (FIG. 6).

The pipeline network 30 shown in FIG. 4 is different from the pipelines in the conventional device shown in FIGS. 1 and 2. The water delivered from the pump 18 and cooled in the cooler 20 is immediately branched into three cooling water supply pipes. Among these pipes, pipes 34a and 34b supply the cooling water to one and the other modules, respectively, each consisting of four modules 10 arranged in the unit 14. A third pipe 36 which is independently of the pipes 34a and 34b supplies the cooling water to the unit 12. The pipe 36 which has reached the unit 12 is branched into two pipes 38a and 38b. The pipes 38a and 38b supply the cooling water to one and the other modules, respectively, each consisting of four modules arranged in the unit 12. The cooling water supplied to the unit 12 is not supplied to the unit 14. The cooling water supplied to the unit 14 is not supplied to the unit 12. Thus, the cooling water is directly supplied to each unit uniformly. The uniform supply of the cooling water is indicated by two lines $L_1$ and $L_2$ in FIG. 3.

Figure 6:
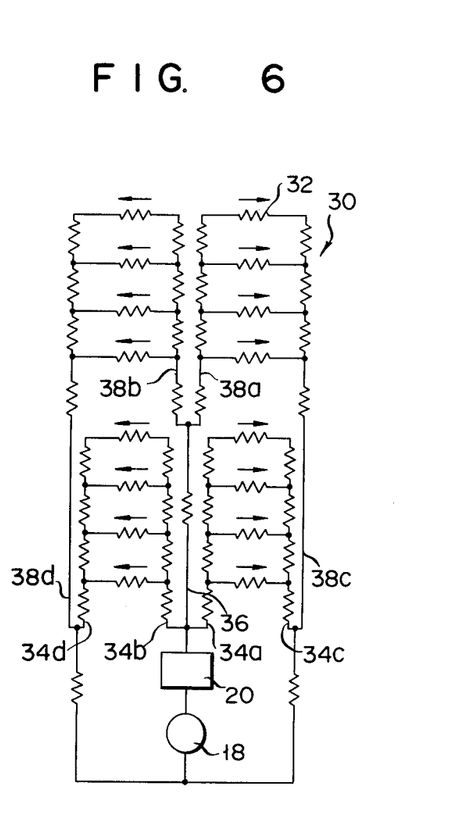
FIG. 6 is a view illustrating a cooling water pipeline network included in the arrangement shown in FIG. 4.

FIG. 6 shows a circuit diagram of the cooling water pipeline network 30 shown in FIG. 4. The water used to cool the modules 10 returns to the suction side of the pump 18 through pipes 34c, 34d, 38c and 38d. The zigzag symbol indicated in each pipe denotes a flow resistance of the pipe.

The cooling water delivered from the pump 18 and drawn thereto is branched through the pipes 34a, 34b, 36, 34c, 34d, 38a, 38b, 38c and 38d shown in FIGS. 4 and 6. Therefore, the diameter of these pipes may be smaller than that of the pipes 122a, 122b, 122c and 122d shown in FIGS. 1 and 2. The electric resistance against the leakage current flowing through the conductors P, M and N in the device shown in FIGS. 4 and 6 is higher than that in the conventional device shown in FIGS. 1 and 2. Therefore, the leakage current is very small.

If three sets of thyristor valves shown in FIG. 4 are assembled to form a three-phase bridge circuit and if the three-phase bridge circuit is connected to a three-phase AC power source, a DC output is obtained from the output terminals of the thyristor conversion device.

Figure 8:
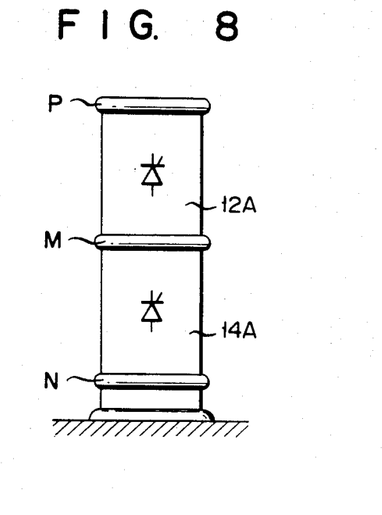
FIG. 8 is a view illustrating a one-phase thyristor valve formed by stacking a high voltage thyristor unit and a low voltage thyristor unit.

FIG. 7 shows a block diagram of a two-stage water-cooled thyristor conversion device using units 12A, 12B and 12C of the high voltage side and units 14A, 14B and 14C of the low voltage side. Reference symbols P and N denote a high voltage terminal and a low voltage terminal, respectively. Reference numeral 40 denotes a three-phase power source. The units 12A and 14A, 12B and 14B, and 12C and 14C are vertically stacked to form first phase, second phase and third phase thyristor valves, respectively. FIG. 8 shows a first columnar-shaped and two-stage thyristor valve having the unit 12A of the high voltage side and the unit 14A of the low voltage side as shown in FIG. 4.

Figure 9:
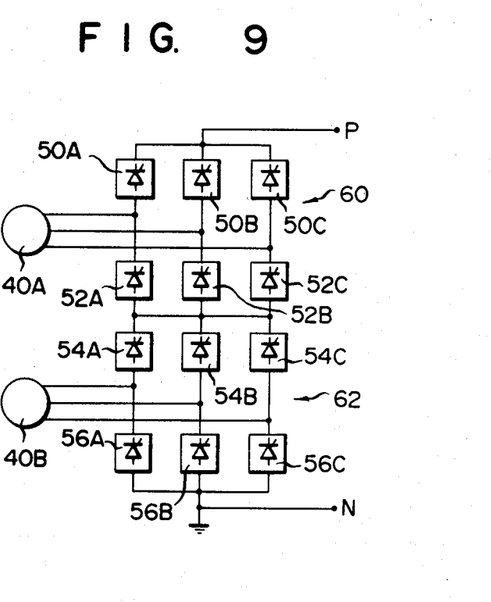
FIG. 9 is a block diagram illustrating connections of a large capacity thyristor conversion device formed by cascade-connecting two three-phase bridge circuits shown in FIG. 7.
Figure 10:
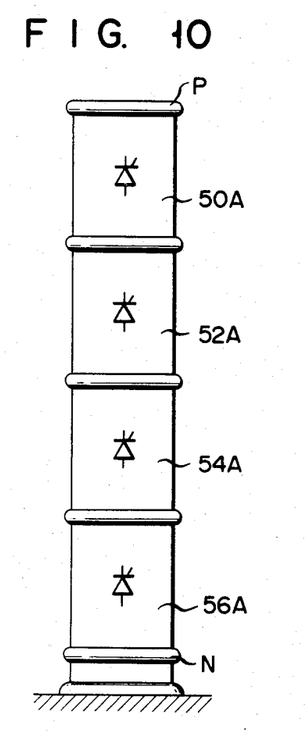
FIG. 10 is a view illustrating a four-stage thyristor valve formed by stacking the four thyristor units of the same phase of FIG. 9.

FIG. 9 is a block diagram of a four-stage water-cooled thyristor conversion device in which a high voltage three-phase bridge circuit 60 having units 50A, 50B, 50C, 52A, 52B and 52C is cascade-connected to a low voltage three-phase bridge circuit 62 having units 54A, 54B, 54C, 56A, 56B and 56C. The units 50A, 52A, 54A and 56A are vertically stacked to form a first phase four-stage thyristor valve. Similarly, the units 50B, 52B, 54B and 56A are stacked to form a second phase four-stage thyristor valve and the units 50C, 52C, 54C and 56C are stacked to form a third phase four-stage thyristor valve. Reference symbols P and N denote the conductors at the output sides. Reference numerals 40A and 40B denote a three-phase power source. FIG. 10 shows the outer appearance of the first phase four-stage thyristor valve comprising the units 50A, 52A, 54A and 56A shown in FIG. 8.

Figure 11:
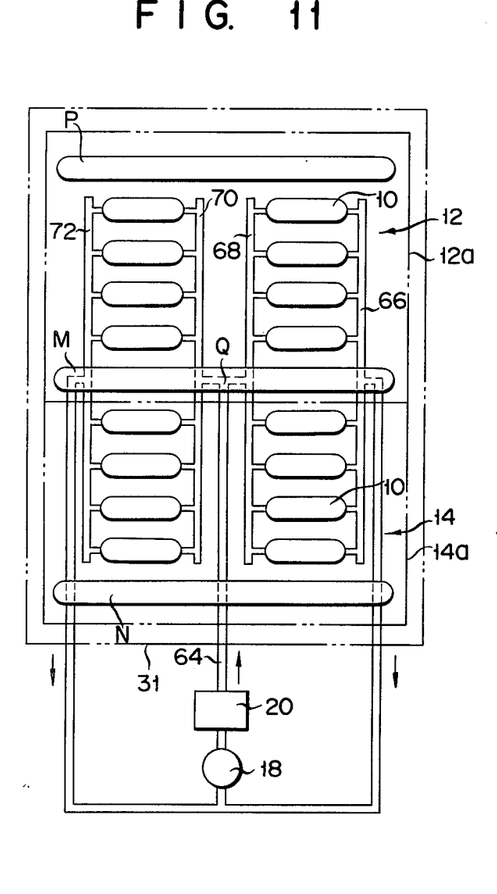
FIG. 11 is a view illustrating a one-phase thyristor valve of a water-cooled high voltage device according to another embodiment of the present invention.
Figure 12:
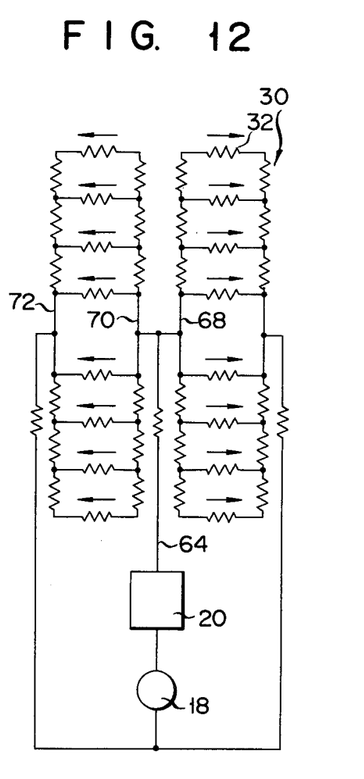
FIG. 12 is a view illustrating a cooling water pipeline network used in the water-cooled high voltage device shown in FIG. 11.

FIG. 11 shows a two-stage water-cooled thyristor conversion device having modules 10 arranged in the same manner as shown in FIG. 4, except that a cooling water pipeline network 31 is provided. In this case, the cooling water supplied from the cooler 20 is raised to a level between the unit 12 of the high voltage side and the unit 14 of the low voltage side through a pipe 64. From this level, the cooling water is branched into the high and low voltage sides and supplied to the units 12 and 14. After uniformly cooling all the modules 10, the cooling water returns to the suction side of the pump 18 as shown in the figure. The cooling water is not branched from the beginning. The cooling water is first raised to high level and supplied to the units 12 and 14. Therefore, the cooling water is substantially uniformly supplied to the units 12 and 14. The diameter of pipes 66, 68, 70 and 72 extending near the conductor P of the high voltage side can be small. The leakage current flowing through the conductors P, M and N is smaller than that in the conventional device shown in FIG. 1. FIG. 12 shows a flow path of the pipeline network shown in FIG. 11. The mode of operation of the circuit diagram in FIG. 12 is substantially the same as that of the circuit diagram in FIG. 5, and a detailed description thereof will be omitted.

In the device shown in FIGS. 11 and 12, a great amount of cooling water is supplied to the modules 10 near a cooling water supply point Q. The amount of cooling water supplied to the modules 10 apart from the cooling water supply point Q is decreased. However, the cooling water is not abruptly decreased as indicated by the lines $L_3$ and $L_4$ in FIG. 3 unlike the conventional case. In the device shown in FIG. 11, large diameter pipes need not be disposed between the terminals P and N, thus decreasing the leakage current between the terminals and the electrical corrosion.

Figure 13:
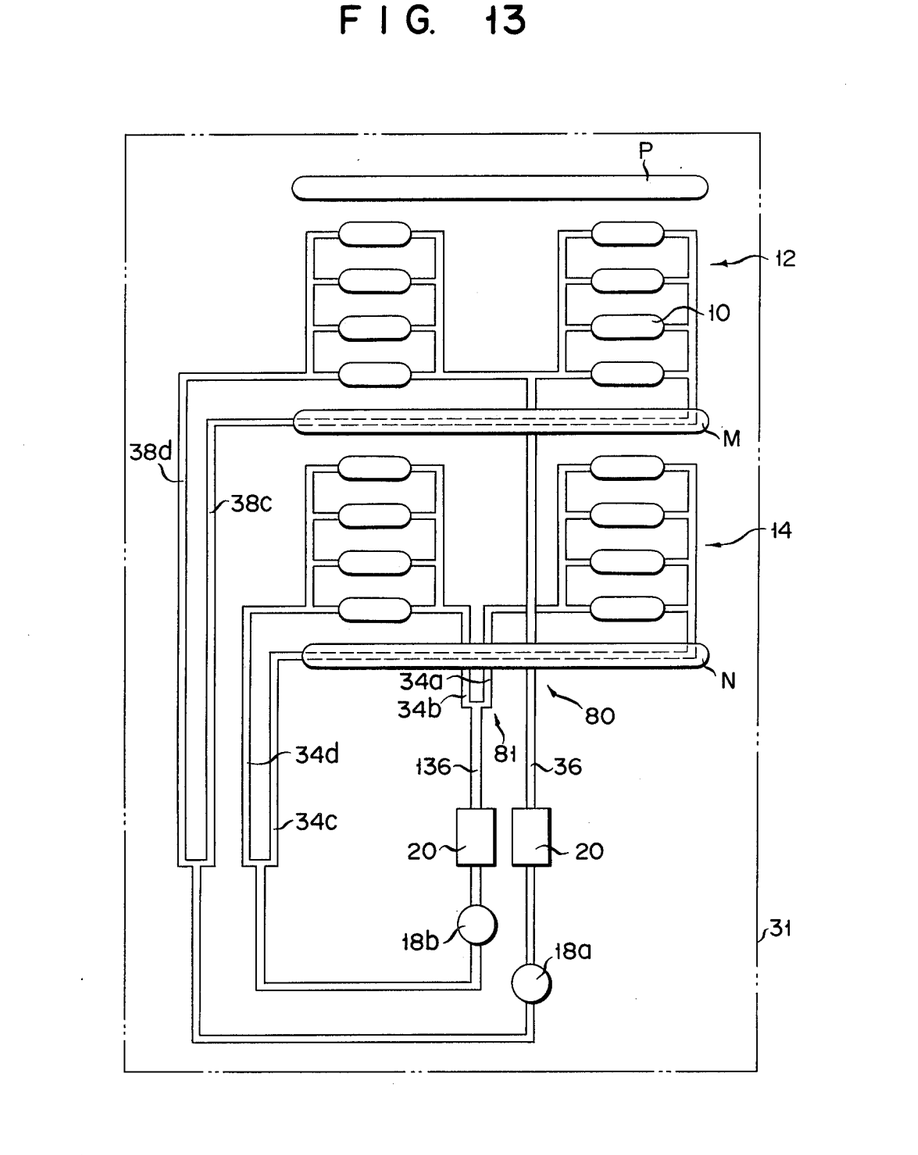
FIGS. 13 and 14 are views for explaining a water-cooled high voltage device according to still another embodiment of the present invention.

FIG. 13 shows a two-stage water-cooled thyristor conversion device, in which a cooling water pipeline network 80 for the unit 12 of the high voltage side and a cooling water pipeline network 81 of the unit 14 of the low voltage side are separately disposed. A high pressure output pump 18a is connected to the unit 12 located at a high level position, while a low pressure output pump 18b is connected to the unit 14 located at a low level position.

The reason of using a high pressure output pump 18a for the unit 12 of the high voltage side is such that the flow speed of the cooling water through the pipe 36 extending between the conductor P of the high voltage side and the conductor N of the low voltage side can be made high even when the diameter of the pipe is small causing to maintain sufficient cooling effect of the modules 10 in the unit 12 of the high voltage side and to obtain large electric resistance of and low leak electric current through the cooling water in the pipe 36.

Figure 14:
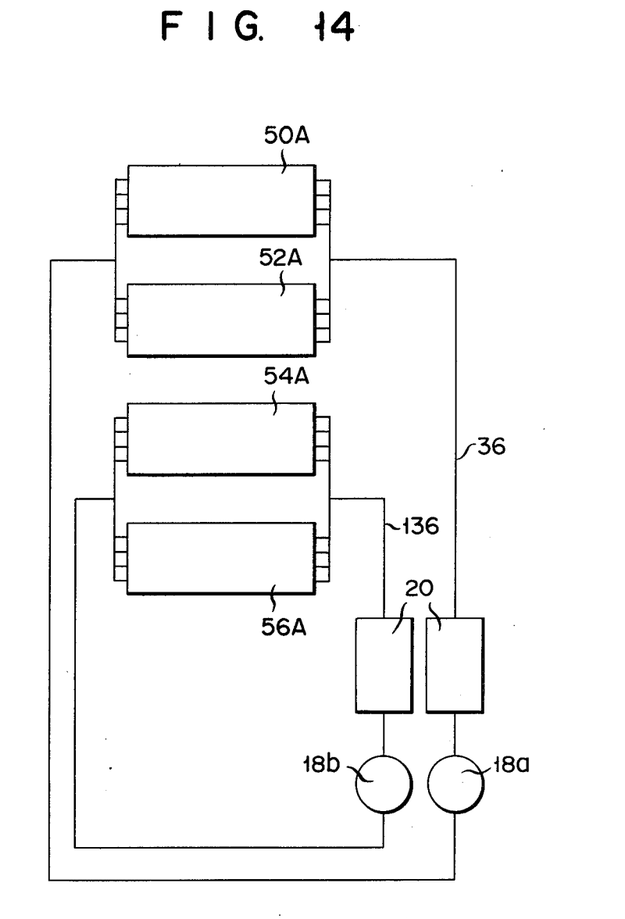

FIG. 14 shows a embodiment of this invention in which units 50A, 52A, 54A and 56A are stacked to form a four stage thyristor valve shown in FIG. 10, and the cooling water pipe line network is formed according to the feature of FIG. 11. In this embodiment, the cooling water is supplied to upper units 50A and 52A from the high pressure output pump 18a through the pipe 36, while the cooling water is supplied to lower units 54A and 56A from the low pressure output pump 18b through a pipe 136.

What we claim is:

1. A water-cooled high voltage device comprising:
   a pluraltiy of electrical units three-dimensionally stacked in a plurality of levels, each electrical unit having a stackable frame and a plurality of electrical modules disposed at said frames;
   pumping means for delivering cooling water; and
   a pipeline network for supplying the cooling water delivered by said pumping means to said electrical modules, said pipeline network having a plurality of pipes each supplying cooling water delivered by said pumping means directly to each of the electrical units and a plurality of pipes each returning the cooling water from each of the electrical units to said pumping means.

2. A water-cooled high voltage device comprising: a plurality of electrical units three-dimensionally stacked in a plurality of levels, each electrical unit having a stackable frame and a plurality of electrical modules disposed at said frame; a pumping means for delivering cooling water; and a pipeline network having a common pipe for supplying the cooling water delivered by said pumping means to said electrical modules, wherein the cooling water from said pumping means is directly supplied through the common pipe to an intermediate level between two electrical units vertically stacked among said electrical units stacked in a plurality of levels.

3. A device according to claim 2, wherein said pumping means comprises a plurality of pumps each having a corresponding pump head and sequentially connected to said electrical units in a pump pressure increasing fashion such that the pump of a higher pressure corresponds to the electrical unit of a higher level position.

4. A device according to the claim 1, 2 or 3 wherein each of electrical modules comprises a plurality of series-connected main electrical circuits, each comprising at least first, and second electrical circuits parallel-connected to each other, said first electrical circuit having a thyristor element and said second electrical circuit having a snubber circuit.

* * * * *